(12) United States Patent
Winn

(10) Patent No.: US 6,891,361 B2
(45) Date of Patent: May 10, 2005

(54) AUTOMATIC GAIN CONTROL (AGC) LOOP FOR CHARACTERIZING CONTINUOUS-TIME OR DISCRETE-TIME CIRCUITRY GAIN RESPONSE ACROSS FREQUENCY

(75) Inventor: Gregory Scott Winn, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 155 days.

(21) Appl. No.: 10/335,555

(22) Filed: Dec. 31, 2002

(65) Prior Publication Data

US 2004/0124827 A1 Jul. 1, 2004

(51) Int. Cl.[7] .............................................. G01R 23/02
(52) U.S. Cl. ...................................... 324/76.39; 360/65
(58) Field of Search .......................... 360/65; 324/76.39

(56) References Cited

U.S. PATENT DOCUMENTS

| | | | | |
|---|---|---|---|---|
| 5,905,601 A | * | 5/1999 | Tsunoda ....................... | 360/51 |
| 6,005,731 A | * | 12/1999 | Foland et al. ................. | 360/53 |
| 6,268,972 B1 | | 7/2001 | Philpott et al. ............... | 360/46 |
| 6,268,974 B1 | * | 7/2001 | Sloan et al. ................... | 360/67 |
| 6,369,741 B1 | * | 4/2002 | Demicheli et al. ........... | 341/155 |
| 6,429,988 B1 | | 8/2002 | Bhaumik et al. ............. | 360/46 |
| 6,441,983 B1 | | 8/2002 | Philpott et al. ............... | 360/67 |
| 6,469,856 B1 | * | 10/2002 | Mitchell et al. ............... | 360/65 |
| 6,552,865 B2 | * | 4/2003 | Cyrusian ....................... | 360/31 |
| 6,636,372 B1 | * | 10/2003 | Nguyen et al. ............... | 360/31 |

OTHER PUBLICATIONS

IBM Technical Disclosure Bulletin, Automatic Gain Control With Equalizer vol. 21, Issue No. 9, pp. 3569–3570, Feb. 1979.*

* cited by examiner

Primary Examiner—Charles H. Nolan, Jr.
(74) Attorney, Agent, or Firm—Yee & Associates

(57) ABSTRACT

The present invention is a method, system, and product for testing operating characteristics of a continuous-time or discrete-time device under test, which is included within a circuit. The operating characteristics of the continuous-time or discrete-time device are tested utilizing electronic components that already exist within the circuit such that a test circuit is not utilized to test the device. The circuit includes a variable gain amplifier and an automatic gain correction (AGC) circuit. The operating characteristics of the device are tested utilizing the variable gain amplifier and said AGC circuit.

39 Claims, 4 Drawing Sheets

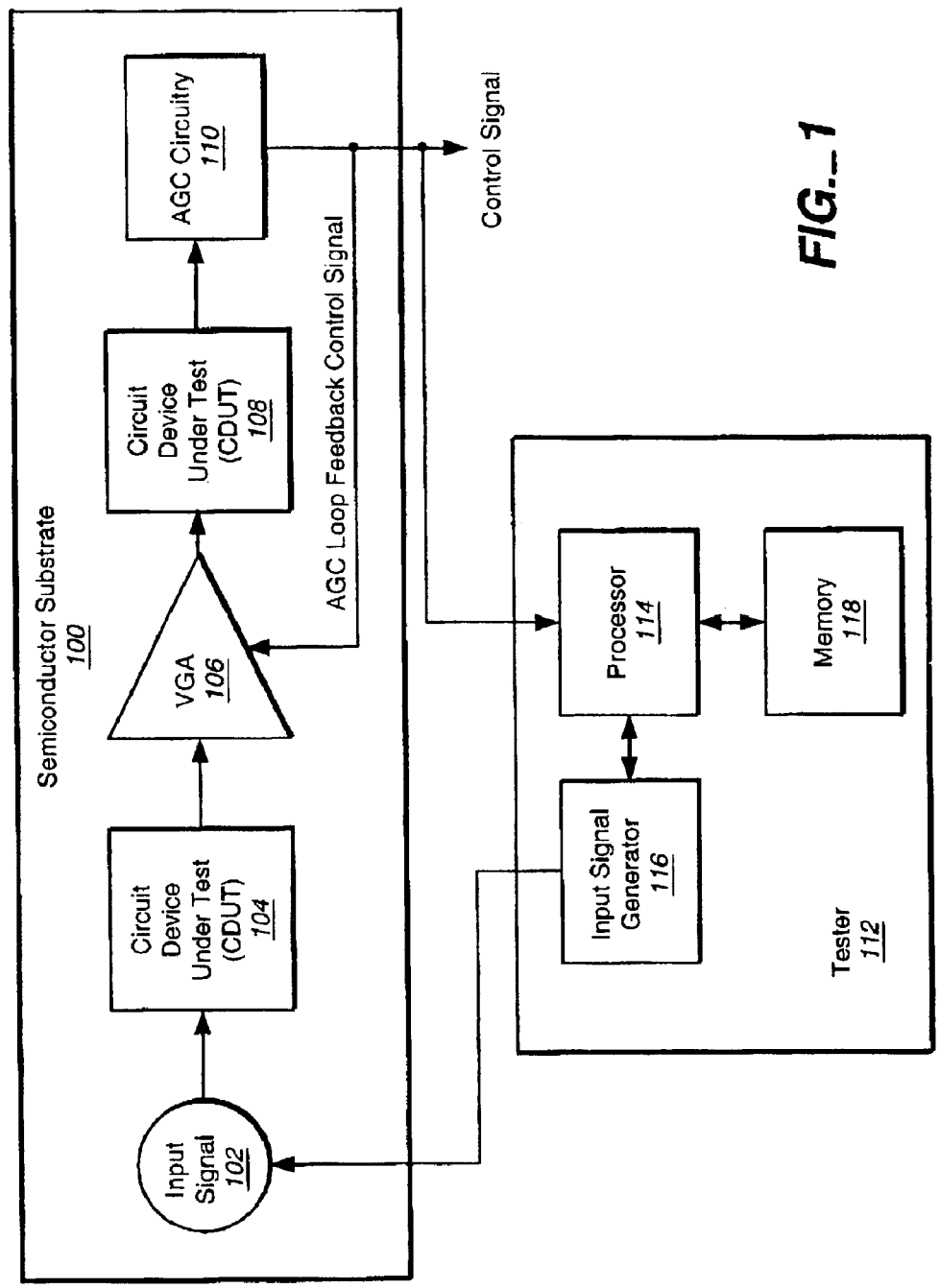
FIG._1

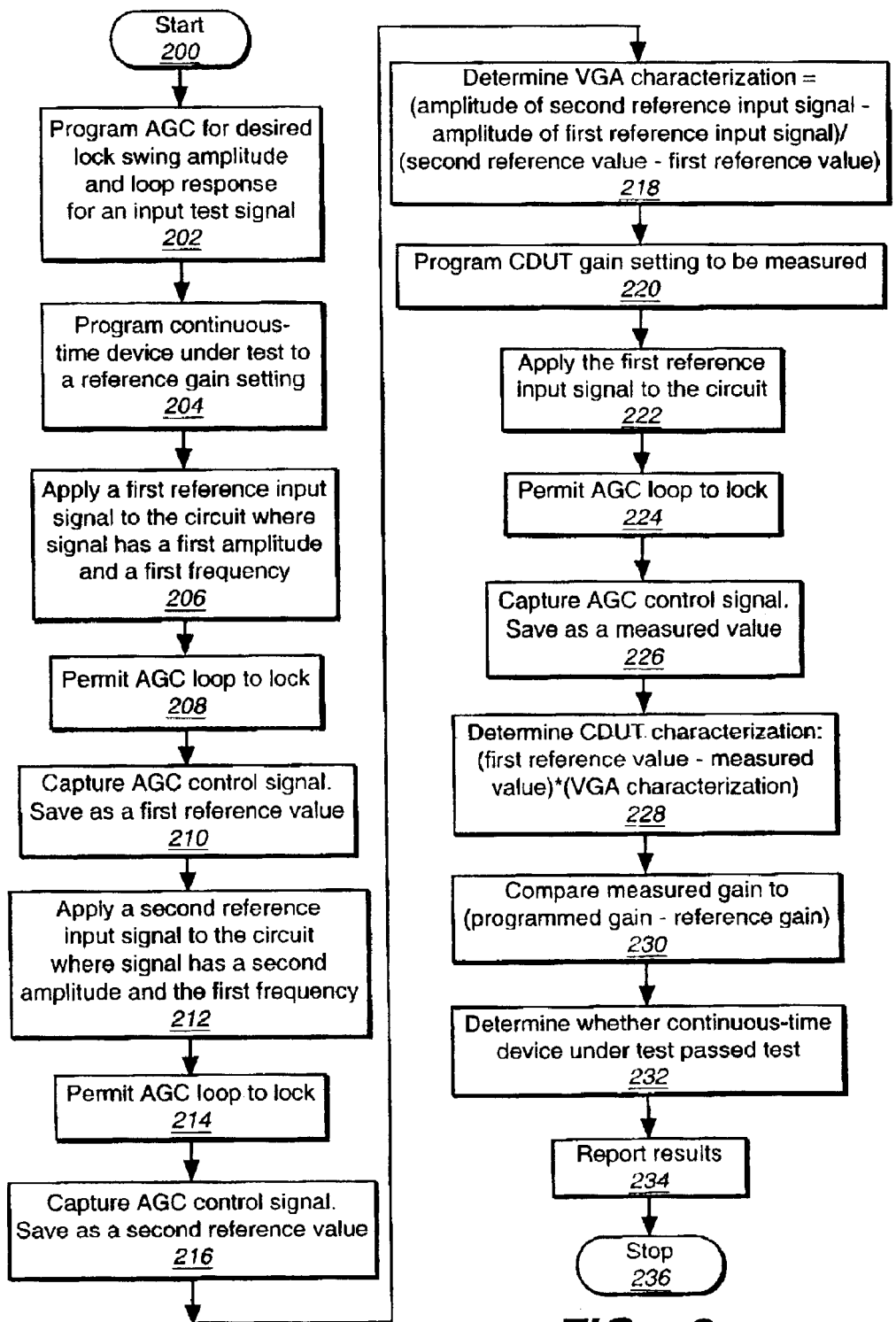
FIG._ 2

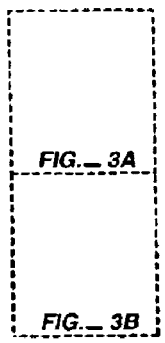
FIG._3
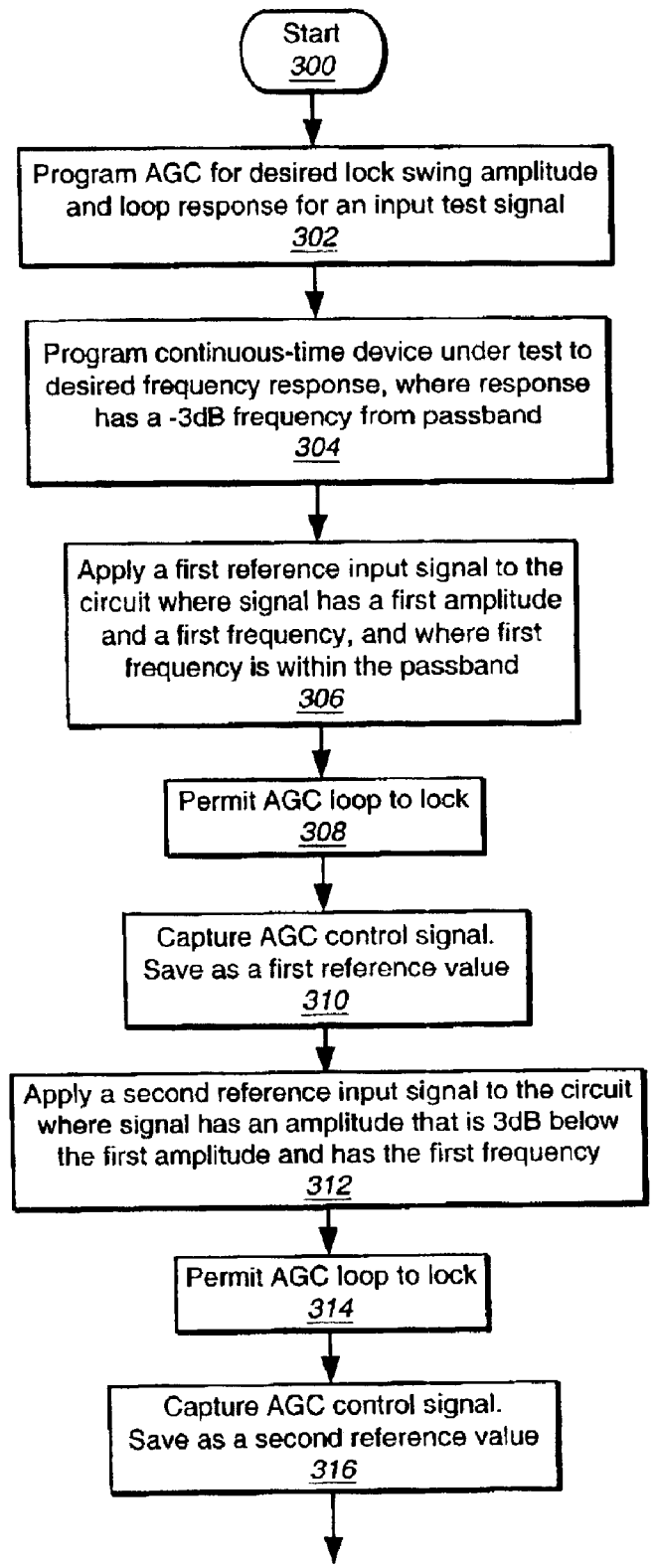
FIG._3A

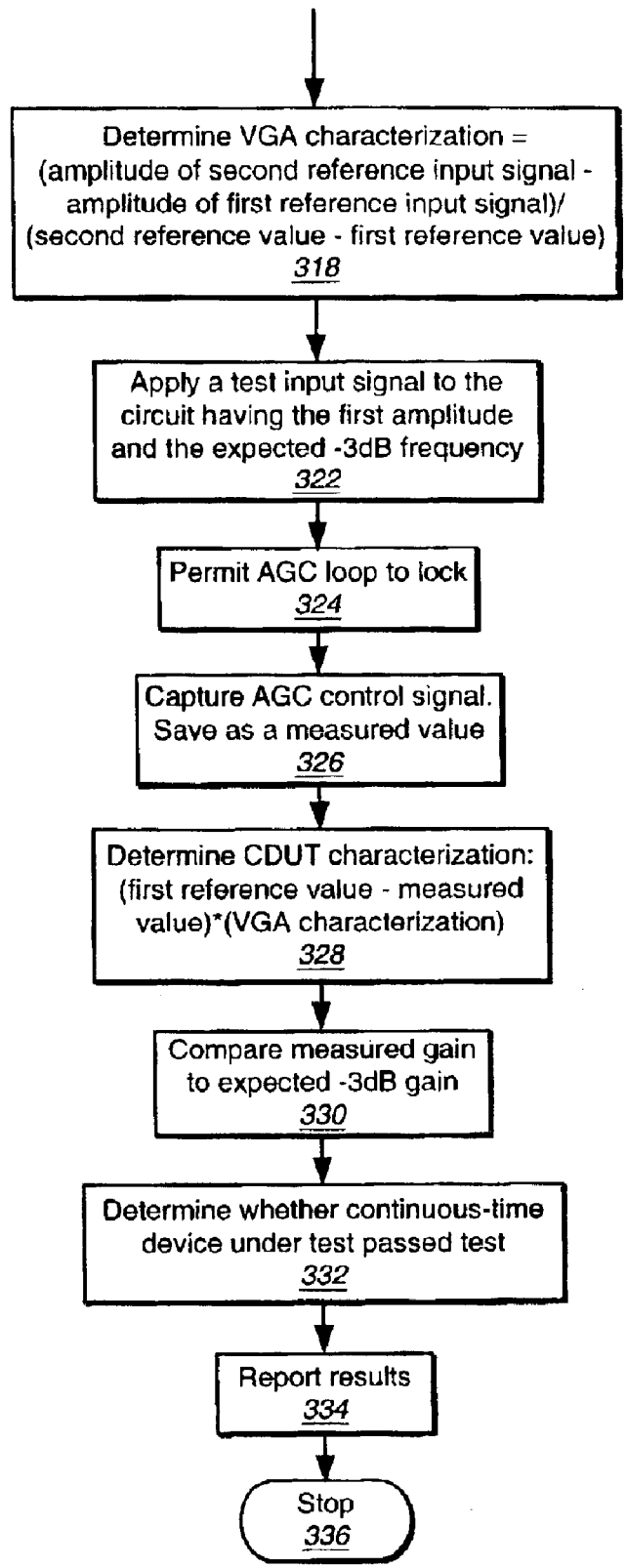
FIG._3B

AUTOMATIC GAIN CONTROL (AGC) LOOP FOR CHARACTERIZING CONTINUOUS-TIME OR DISCRETE-TIME CIRCUITRY GAIN RESPONSE ACROSS FREQUENCY

BACKGROUND OF THE INVENTION

1. Technical Field

The present invention relates generally to a method, system, and product for testing electronic circuits, and more particularly to a method, system, and product for testing the gain versus frequency of continuous-time or discrete-time devices that are included within an electronic circuit, where the device is tested utilizing an automatic gain control (AGC) circuit that is preexisting within the electronic circuit.

2. Description of the Related Art

Magnetic media is effectively used to store digital data in applications such as tape or disk storage systems. Data is written onto the magnetic material by a write head. The write head converts a current signal containing the digital information into flux patterns, which are written as field transitions onto the magnetic material. The data is retrieved when the magnetic media is passed by a read head. The read head passes over the magnetic medium and transduces the magnetic transitions into pulses in an analog read signal, which are then decoded by read channel circuitry to reproduce the digital sequence.

Read channels often include a continuous-time devices, such as a filter for filtering signals and amplification for adjusting the amplitude of the signal read from a magnetic tape. A filter employed in a read channel must generally be capable of accommodating variations in the data rate of the readback signals transmitted through the read channel. The ability to precisely tune such a filter is therefore of particular importance. Gain circuitry must also be precisely set to optimize the dynamic range of the signal throughout the read channel.

In order to more precisely adjust these devices, such as by tuning the frequency response of a filter or the gain of an amplifier, it is necessary to characterize the operating conditions of the devices. In the prior art, in order to characterize the operating conditions of a circuit, an input test signal was provided to the circuit and the output generated by the circuit was analyzed by a separate test circuit, which was typically an off-chip tester. This approach to characterizing a circuit requires expensive off-chip tester features and control and requires time-consuming post processing of the input and output signals for the characterization to be complete. In read channel application, the preexisting variable gain amplifier and AGC loop can be used to greatly simplify the existing techniques for the device characterization.

Therefore, a need exists for a method, system, and product for testing devices that are included within an electronic circuit in a timely cost efficient manner, utilizing circuit elements that already exist within the electronic circuit.

SUMMARY OF THE INVENTION

The present invention is a method, system, and product for testing operating characteristics of a continuous-time or discrete-time device under test, which is included within a circuit. The operating characteristics of the device are tested utilizing common electronic components, including a variable gain amplifier (VGA) and an automatic gain correction (AGC) circuit, which may already exist within the circuit such that additional test circuitry is not required to test the device. The operating characteristics of the device are tested utilizing the variable gain amplifier and said AGC circuit.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 1 is a block diagram of a continuous-time or discrete-time circuit device under test (CDUT), which is tested utilizing preexisting components of the circuit in accordance with the present invention;

FIG. 2 illustrates a high level flow chart which depicts testing a gain of a device that is included within an electronic circuit utilizing components that already exist within the circuit in accordance with the present invention; and FIG. 3 depicts a high level flow chart, which illustrates testing the gain response across frequency of a device that is included within an electronic circuit utilizing components that already exist within the circuit in accordance with the present invention.

DETAILED DESCRIPTION

The description of the preferred embodiment of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention and the practical application to enable others of ordinary skill in the art to understand the invention for various embodiments with various modifications as are suited to the particular use contemplated.

The present invention is a method, system, and product for testing operating characteristics of a device under test, which is included within a circuit. The circuit includes a variable gain amplifier (VGA) and an automatic gain correction (AGC) circuit. The operating characteristics of the device are tested utilizing the preexisting VGA and AGC circuit. In this manner, a test circuit is not utilized to test the continuous time device. Of course, those skilled in the art will recognize that components, such as VGA and AGC circuitry may be added to a circuit in order to execute the method of the present invention.

The present invention is described utilizing an electronic circuit such as a read channel that may be included within a disk or tape drive. However, those skilled in the art will recognize that the present invention may be utilized in any circuit having a continuous-time or discrete-time device that is to be tested where the circuit includes a gain modifying amplifier and an automatic gain correction circuit.

A variable gain amplifier provides an adjustable gain of an input signal and is controlled by a gain control signal from an AGC circuit. Automatic gain correction (AGC), also called automatic gain control, circuits are well known and are commonly used for varying the gain of an input signal to provide an output signal having a substantially constant power level. Such circuits may be used in a wide variety of applications, such as disk or tape drives. In a typical AGC circuit, a variable gain component, such as a VGA, receives the input signal and produces an output signal. A difference between an amplitude of the output signal and a reference value is determined. This difference is integrated and fed back to the variable gain component to adjust the gain of the input signal to maintain the amplitude of the output signal within a predetermined operating window. An AGC circuit therefore allows an input signal to be adjusted before it is further processed.

The present invention uses an automatic gain correction (AGC) loop to characterize the gain response across frequency of continuous-time or discrete-time circuitry, such as a circuit device under test (CDUT). In addition to characterization, the present invention can reduce defect detection time in an automatic test equipment (ATE) environment, thus reducing test cost. The basic premise of the invention is that the AGC loop feedback control response contains information about the signal amplitude of the signal it is detecting. Thus, if the gain response of the circuitry for which the AGC loop is adjusting gain is known, at a given frequency of interest the control output of the AGC loop can be used, whether it is analog or digital, to determine if the CDUT is behaving as expected.

The device under test may be a continuous-time device or a discrete-time device.

FIG. 1 depicts a block diagram of a read channel implementation circuit including a device under test (CDUT), that is included within a circuit, which is tested utilizing preexisting components of the circuit in accordance with the present invention. The preexisting circuit will include at least a gain modifying amplifier and AGC circuitry, which receives and adjusts the output of the circuit device under test. One or more CDUTs may be included within the preexisting circuitry.

In the depicted example, a single chip, or semiconductor substrate 100, includes the components of a preexisting circuit. The preexisting circuit receives an input signal 102, and includes a CDUT 104, a VGA 106, a CDUT 108, and AGC circuitry 110. As described, the device under test may be located as depicted by CDUT 104, CDUT 108, or both CDUTs 104 and 108. The circuit device under test (CDUT) may reside before and/or after the gain modifying amplifier, in this case a variable gain amplifier (VGA 106). An input signal 102 is received either directly by CDUT 104 or directly by VGA 106. Input signal 102 will typically be a sine-wave, but may be something more complicated. Input signal 102 will typically be an off-chip signal source. The output of the VGA 106 will either be received directly by CDUT 108, or by AGC 110. An ADC may also be included (not shown) for converting an analog continuous-time signal into a digital continuous-time signal. AGC 110 will determine if the amplitude is at the pre-programmed desired level, and will either reduce or increase the gain of VGA 106 to reach the desired amplitude through the feedback path as shown. By monitoring the AGC loop feedback control signal, one can determine if the CDUT has the correct gain response across frequency.

A tester 112 is depicted which is separate from chip 100. Tester 112 includes a processor 114, a signal generator 116, and a memory 118. Processor 114 executes the method of the present invention. Memory 118 is utilized to store measured values. And, signal generator 116 is utilized, controlled by processor 114, to generate input and test signals having a particular amplitude and frequency characteristics. Tester 112 is used to provide a test signal and to store intermediate test values and the results of the test. However, the actual testing of the CDUT is executed utilizing the components of chip 100.

A specific example of using this invention to characterize or determine defects of gain is to measure the passband gain of a CDUT with a variety of gain settings. The CDUT could be an amplifier, which could reside either before or after VGA 106. To utilize the present invention in a continuous-time application, the VGA gain response versus control must be determined in a characterization step. To do this, a first reference point is obtained. The CDUT must be set to a reference gain setting. An input signal generated by signal generator 116 will typically be a sine-wave at a specific frequency in the known passband of the VGA and the CDUT. The AGC loop response to the input signal must be programmed to adjust VGA 106 to achieve a desired signal swing throughout the continuous-time device once gain is locked. If the input frequency changes throughout a given measurement, the AGC parameters must be set to give the same locked amplitude across the frequencies of interest. In a digital AGC loop implementation, the oversample rate will additionally need to be considered. The input amplitude of the signal source is chosen depending on the gain range of VGA 106, with respect to the programmed lock signal amplitude. The AGC 110 control signal is then captured. This is the first reference value. To characterize the VGA gain response versus the AGC control signal, a second point in the gain response must be determined. This is accomplished by applying a second signal generated by signal generator 106 that has a different amplitude, but the same frequency as the first input signal. AGC 110 is then allowed to re-lock the VGA gain. The AGC control signal is again captured and is the second reference value. Since the difference in input signal amplitude is known, the VGA dB/control signal can be calculated using the first and second reference values. This completes the VGA characterization process. For a discrete-time application of this invention, characterizing the VGA, or multiplier block, will most likely not be required since the amplification is perfectly repeatable from chip die to die in a digital implementation.

Now, the CDUT can be characterized. In this example, the CDUT is an amplifier with various gain settings. The invention will determine the relative gain of the CDUT when compared to the reference gain setting used during the VGA characterization steps. The input signal source amplitude returned to its original reference amplitude, e.g. the first input signal is again generated having the first amplitude and first frequency. AGC 110 is allowed to re-lock and the new AGC control signal is captured. This new AGC control signal is referred to as a measured value. The difference between the first reference value and this measured value multiplied by the VGA dB/control value is the gain change of the amplifier from the reference gain setting to the new gain setting. In this manner, all of the gain settings for the CDUT amplifier can be measured and compared to expected results.

FIG. 2 illustrates a high level flow chart that depicts testing a circuit device under test, such as a continuous-time device, that is included within an electronic circuit utilizing components that already exist within the circuit in accordance with the present invention. Specifically, FIG. 2 depicts testing the gain of a such as a continuous-time device. The process starts as illustrated by block 200 and thereafter passes to block 202, which depicts programming the AGC for the desired lock swing amplitude and loop response for an input test signal. Thereafter, block 204 illustrates programming the CDUT under test to a reference gain setting. The process then passes to block 206, which depicts applying a first reference input signal to the circuit where the signal has a first amplitude and a first frequency. Thus, the first reference input signal is applied in place of input signal 102, shown in FIG. 1.

Block 208 then illustrates permitting the AGC loop to lock. Next, block 210 depicts capturing the AGC control signal. This signal is saved as a first reference value. Thereafter, block 212 illustrates applying a second reference input signal to the circuit where the signal has a second amplitude and the first frequency. The process then passes to block 214, which depicts permitting the AGC loop to lock. Next, block 216 illustrates capturing the AGC control signal. This signal is saved as a second reference value.

Then, block 218 depicts characterizing the VGA. The VGA is characterized by subtracting the amplitude of the second reference input signal from the amplitude of the first reference input signal. This result is then divided by the result of the first reference value subtracted from the second reference value. The process then passes to block 220 which illustrates programming the CDUT gain setting to be measured. Thereafter, block 222 depicts applying the first reference input signal again to the circuit.

Next, block 224 illustrates permitting the AGC loop to lock. Then, block 226 depicts capturing the AGC control signal, and saving it as a measured value. The process then passes to block 228, which illustrates characterizing the CDUT by determining a measured gain. The measured gain of the CDUT is determined by subtracting the measured value from the first reference value and multiplying the resulting value by the VGA characterization. Thereafter, block 230 depicts comparing the measured gain to the value of the expected programmed gain minus the reference gain. Next, block 232 illustrates determining whether the CDUT passed the test utilizing this comparison. Block 234, then, depicts reporting the results of the determination. The process then terminates as illustrated by block 236.

The following is an example of an amplitude gain measurement utilizing the process described by FIG. 2 for a digital AGC system, using the block diagram labeled in FIG. 1. AGC 110 is first set to lock its input to a 1 volt swing, taking into consideration the AGC loop response characteristics at the input signal frequency, and sample rate if the AGC system is digitally implemented. Thereafter an amplifier CDUT, either CDUT 104 or 108, is set to a particular reference gain. A 100 mV, 10 MHz input signal, which is within the passband of the CDUT and the VGA, is applied as a first input signal. A control signal of AGC 110 is then captured and stored having a first reference value of 50 decimal. A second signal, a 200 mV, 10 MHz input signal which is within the passband of the CDUT, is applied as a second input signal. This second input signal is 6 dB higher than the first input signal. Another control signal of AGC 110 is then captured and stored having a second reference value of 45 decimal. The VGA is then characterized by calculating (6 dB)/(40–50) which is 0.6 dB/code.

In order to characterize the CDUT, the CDUT is programmed to a particular gain setting. In this example, CDUT is programmed for a +3 dB gain of the reference gain. The first input signal is again applied. AGC 110 is again permitted to lock and the control signal is captured and stored as a measured value. At this time the control signal that is stored as the measured value is 45 decimal. A measured gain is calculated by determining (50–45 codes)*(0.6 dB/code) is 3 dB. This CDUT passed the test because the CDUT was programmed for a 3 dB gain over the reference gain.

Another pertinent example of using this invention expands its use to the frequency domain by measuring either the cut-in, cut-off, or boost frequency response of a continuous-time filter (CTF) CDUT. The VGA dB/control must again be determined through a characterization step in the passband of the CDUT's and VGA's frequency response. If the −3 dB amplitude point was the desired measurement, it would be wise to set the second input signal amplitude to −3 dB of the reference signal amplitude when determining the dB/control characterization. The actual −3 dB measurement would consist of applying an input signal sine-wave at the expected −3 dB frequency at the reference signal amplitude. The AGC loop is then allowed to lock and the control value is captured and stored. The difference between the reference control and this measurement control multiplied by the VGA dB/control is the amount of dB down at the measured frequency.

FIG. 3 depicts a high level flow chart that depicts testing a frequency response of a continuous-time device that is included within an electronic circuit utilizing components that already exist within the circuit in accordance with the present invention. The process starts as illustrated by block 300 and thereafter passes to block 302, which depicts programming the AGC for the desired lock swing amplitude and loop response for an input test signal. Thereafter, block 304 illustrates programming the continuous-time device (CDUT) under test to the desired frequency response, where the response has a −3 dB frequency from passband. The process then passes to block 306 which depicts applying a first reference input signal to the circuit where the signal has a first amplitude and a first frequency, and where the first frequency is within the passband of the circuit under test and the VGA.

Block 308 then illustrates permitting the AGC loop to lock. Next, block 310 depicts capturing the AGC control signal. This signal is saved as a first reference value. Thereafter, block 312 illustrates applying a second reference input signal to the circuit where the signal has a second amplitude that is 3 dB below the first amplitude. The second reference signal has the first frequency. The process then passes to block 314, which depicts permitting the AGC loop to lock. Next, block 316 illustrates capturing the AGC control signal. This signal is saved as a second reference value.

Then, block 318 depicts characterizing the VGA. The VGA is characterized by subtracting the amplitude of the second reference input signal from the amplitude of the first reference input signal. This result is then divided by the result of the first reference value subtracted from the second reference value. The process then passes to block 322, which depicts applying a test input signal to the circuit, which has the first amplitude and the expected −3 dB frequency.

Next, block 324 illustrates permitting the AGC loop to lock. Then, block 326 depicts capturing the AGC control signal, and saving it as a measured value. The process then passes to block 328, which illustrates characterizing the CDUT. The measured gain of the CDUT is determined by subtracting the measured value from the first reference value and multiplying the resulting value by the VGA characterization. Thereafter, block 330 depicts comparing the measured gain to the expected value of −3 dB. Next, block 332 illustrates utilizing this comparison to determine whether the CDUT passed the test. Block 334, then, depicts reporting the results of the determination. The process then terminates as illustrated by block 336. It is important to note that the gain of a digital discrete-time multiplier may be characterized in a similar manner using this invention.

The following is an example of a frequency response measurement utilizing the process described by FIG. 3 for a digital AGC system, using the block diagram labeled in FIG. 1. AGC 110 is first set to lock its input to a 1 volt swing, taking into consideration the AGC loop response characteristics at the input signal frequency, and sample rate if the AGC system is digitally implemented. Thereafter a continuous-time filter CDUT, either CDUT 104 or 108, is set to a particular frequency response. A 100 mV, 10 MHz input signal, which is within the passband of the CDUT and the VGA, is applied as a first input signal. A control signal of AGC 110 is then captured and stored having a first reference value of 80 decimal. A second signal, a 70.7 mV, 10 MHz input signal, which is within the passband of the CDUT, is applied as a second input signal. This second signal is 3 dB lower than the first signal. Another control signal of AGC 110 is then captured and stored having a second reference value of 90 decimal. The VGA is then characterized by calculating (3 dB)/(90–80) which is 0.3 dB/code.

A test input signal is then applied having the amplitude of the first input signal and the frequency of the anticipated −3 dB response. For this particular CDUT, the filter is expected to have a −3 dB cutoff at 14 MHz. Therefore, the test signal is a 100 mV, 14 MHz signal. AGC 110 is again permitted to lock and the control signal is captured and stored as a measured value. At this time the control signal that is stored as the measured value is 90 decimal. A measured gain is calculated by determining (80–90 codes)*(0.3 dB/code) which is 3 dB. Thus, the CDUT passed the test because the CDUT was programmed for a −3 dB amplitude at the second frequency. It is important to note that the gain versus frequency response of a digital discrete-time filter may be characterized in a similar manner using this invention.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method for testing operating characteristics of a device under test, which is included within a circuit, said method comprising the steps of:

testing operating characteristics of said device utilizing electronic components that already exist within said circuit, wherein a test circuit is not utilized to test said continuous time device;

said circuit including a variable gain amplifier (VGA) and an automatic gain correction (AGC) circuit;

testing said operating characteristics of said device utilizing said variable gain amplifier and said AGC circuit;

programming said AGC for a first reference gain setting;

programming said device for a first reference gain;

applying a first reference input signal to said circuit, said first reference input signal having a first amplitude;

capturing a first control signal value output from said AGC and input to said VGA to control a gain of said VGA;

applying a second reference input signal to said circuit, said second reference input signal having a second amplitude;

capturing a second control signal value output from said AGC and input to said VGA to control a gain of said VGA; and characterizing said VGA by determining a difference between said first amplitude and said second amplitude with respect to a difference between said first control signal value and said second control signal value.

2. The method according to claim 1, wherein said circuit is a read channel, said read channel including said device, said VGA, and said AGC circuit for reading data, and further wherein said device, said VGA, and said AGC circuit are said components that exist within said read channel for reading said data.

3. The method according to claim 1, further comprising the steps of:

determining operating characteristics of said VGA; and determining said operating characteristics of said device utilizing said operating characteristics of said VGA.

4. The method according to claim 1, further comprising the step of:

testing a gain response of said device.

5. The method according to claim 1, further comprising the step of:

testing frequency and gain responses of said device.

6. The method according to claim 1, further comprising the step of:

testing said operating characteristics of said device by comparing a change in said AGC circuit control with a change in input signals.

7. The method according to claim 1, further comprising the steps of:

programming said device for a second reference gain, wherein an expected delta gain is a difference between said first and second reference gain settings;

applying said first reference input signal to said circuit;

capturing a third control signal value output from said AGC and input to said VGA to control a gain of said VGA; and characterizing said device by determining a difference between said first control signal and said third control signal times said VGA characterization.

8. The method according to claim 7, further comprising the step of:

determining whether said device passed said test by comparing said characterization of said device to a difference between said first and second reference gains.

9. The method according to claim 1, further comprising the steps of:
- programming said device for a particular frequency response, said device having a particular gain in a passband of said device, said device having a gain that is known at a particular frequency when said device is programmed for said particular frequency response;
- applying a first reference input signal to said circuit, said first reference input signal having a first amplitude and a first frequency;
- capturing a first control signal value output from said AGC and input to said VGA to control a gain of said VGA;
- applying a second reference input signal to said circuit, said second reference input signal having a second amplitude and having said first frequency;
- capturing a second control signal value output from said AGC and input to said VGA to control a gain of said VGA; and
- characterizing said VGA by determining a difference between said first amplitude and said second amplitude with respect to a difference between said first control signal value and said second control signal value.

10. The method according to claim 9, further comprising the steps of:
- applying a test input signal to said circuit, said test input signal having said first amplitude and said particular frequency;
- capturing a third control signal value output from said AGC and input to said VGA to control a gain of said VGA; and
- characterizing said device by determining a result of a value times said VGA characterization, said value being a difference of said first control signal value and said third value.

11. The method according to claim 10, further comprising the step of:
- determining whether said device passed said test by comparing said characterization of said device to an expected gain response versus frequency.

12. A method according to claim 1, wherein said device under test is a continuous-time device.

13. A method according to claim 1, wherein said device under said device under test is a discrete-time device.

14. A system for testing operating characteristics of a device under test, which is included within a circuit, said system comprising:
- testing means for testing operating characteristics of said device utilizing electronic components that already exist within said circuit, wherein a test circuit is not utilized to test said continuous time device;
- said circuit including a variable gain amplifier (VGA) and an automatic gain correction (AGC) circuit;
- said testing means including said variable gain amplifier and said AGC circuit for testing said operating characteristics of said device;
- programming means for programming said AGC for a first reference gain setting;
- programming means for programming said device for a first reference gain;
- a first reference input signal being applied to said circuit, said first reference input signal having a first amplitude;
- capturing means for capturing a first control signal value output from said AGC and input to said VGA to control a gain of said VGA;
- a second reference input signal being applied to said circuit, said second reference input signal having a second amplitude;
- capturing means for capturing a second control signal value output from said AGC and input to said VGA to control a gain of said VGA; and
- characterizing means for characterizing said VGA by determining a difference between said first amplitude and said second amplitude with respect to a difference between said first control signal value and said second control signal value.

15. The system according to claim 14, wherein said circuit is a read channel, said read channel including said device, said VGA, and said AGC circuit for reading data; and further wherein said device, said VGA, and said AGC circuit are said components that exist within said read channel for reading said data.

16. The system according to claim 14, further comprising:
- determining means for determining operating characteristics of said VGA; and
- determining means for determining said operating characteristics of said device utilizing said operating characteristics of said VGA.

17. The system according to claim 14, further comprising:
- testing means for testing a gain response of said device.

18. The system according to claim 14, further comprising:
- testing means for testing frequency and gain responses of said device.

19. The system according to claim 14, further comprising:
- testing means for testing said operating characteristics of said device by comparing a change in said AGC circuit control with a change in input signals.

20. The system according to claim 14, further comprising:
- programming means for programming said device for a second reference gain, wherein an expected delta gain is a difference between said first and second reference gain settings;
- said first reference input signal being applied to said circuit;
- capturing means for capturing a third control signal value output from said AGC and input to said VGA to control a gain of said VGA; and
- characterizing means for characterizing said device by determining a difference between said first control signal and said third control signal times said VGA characterization.

21. The system according to claim 14, further comprising:
- determining means for determining whether said device passed said test by comparing said characterization of said device to a difference between said first and second reference gains.

22. The system according to claim 14, further comprising:
- said device being programmed for a particular frequency response, said device having a particular gain in a passband of said device, said device having a gain that is known at a particular frequency when said device is programmed for said particular frequency response;
- a first reference input signal being applied to said circuit, said first reference input signal having a first amplitude and a first frequency;
- a first control signal value output being captured from said AGC and input to said VGA to control a gain of said VGA;
- a second reference input signal being applied to said circuit, said second reference input signal having a second amplitude and having said first frequency;

a second control signal value output being captured from said AGC and input to said VGA to control a gain of said VGA; and characterizing means for characterizing said VGA by determining a difference between said first amplitude and said second amplitude with respect to a difference between said first control signal value and said second control signal value.

23. The system according to claim 22, further comprising:
a test input signal being applied to said circuit, said test input signal having said first amplitude and said particular frequency;

a third control signal value output being captured from said AGC and input to said VGA to control a gain of said VGA; and characterizing means for characterizing said device by determining a result of a value times said VGA characterization, said value being a difference of said first control signal value and said third value.

24. The system according to claim 23, further comprising:
determining means for determining whether said device passed said test by comparing said characterization of said device to a an expected gain response versus frequency.

25. The system according to claim 14, wherein said device under test is a continuous-time device.

26. The system according to claim 14, wherein said device under test is a discrete-time device.

27. A computer program product in a data processing system for testing operating characteristics of a device under test, which is included within a circuit, said product comprising:
instruction means for testing operating characteristics of said device utilizing electronic components that already exist within said circuit, wherein a test circuit is not utilized to test said continuous time device;

said circuit including a variable gain amplifier (VGA) and an automatic gain correction (AGC) circuit;

instruction means for testing said operating characteristics of said device utilizing said variable gain amplifier and said AGC circuit;

instruction means for programming said AGC for a first reference gain setting;

instruction means for programming said device for a first reference gain;

instruction means for applying a first reference input signal to said circuit, said first reference input signal having a first amplitude;

instruction means for capturing a first control signal value output from said AGC and input to said VGA to control a gain of said VGA;

instruction means for applying a second reference input signal to said circuit, said second reference input signal having a second amplitude;

instruction means for capturing a second control signal value output from said AGC and input to said VGA to control a gain of said VGA; and instruction means for characterizing said VGA by determining a difference between said first amplitude and said second amplitude with respect to a difference between said first control signal value and said second control signal value.

28. The product according to claim 27, wherein said circuit is a read channel, said read channel including said device, said VGA, and said AGC circuit for reading data; and further wherein said device, said VGA, and said AGC circuit are said components that exist within said read channel for reading said data.

29. The product according to claim 27, further comprising:
instruction means for determining operating characteristics of said VGA; and instruction means for determining said operating characteristics of said device utilizing said operating characteristics of said VGA.

30. The product according to claim 27, further comprising:
instruction means for testing a gain response of said device.

31. The product according to claim 27, further comprising:
instruction means for testing frequency and gain responses of said device.

32. The product according to claim 27, further comprising:
instruction means for testing said operating characteristics of said device by comparing a change in said AGC circuit control with a change in input signals.

33. The product according to claim 27, further comprising:
instruction means for programming said device for a second reference gain, wherein an expected delta gain is a difference between said first and second reference gain settings;

instruction means for applying said first reference input signal to said circuit;

instruction means for capturing a third control signal value output from said AGC and input to said VGA to control a gain of said VGA; and instruction means for characterizing said device by determining a difference between said first control signal and said third control signal times said VGA characterization.

34. The product according to claim 33, further comprising:
instruction means for determining whether said device passed said test by comparing said characterization of said device to a difference between said first and second reference gains.

35. The product according to claim 27, further comprising:
instruction means for programming said device for a particular frequency response, said device having a particular gain in a passband of said device, said device having a gain that is known at a particular frequency when said device is programmed for said particular frequency response;

instruction means for applying a first reference input signal to said circuit, said first reference input signal having a first amplitude and a first frequency;

instruction means for capturing a first control signal value output from said AGC and input to said VGA to control a gain of said VGA;

instruction means for applying a second reference input signal to said circuit, said second reference input signal having a second amplitude and having said first frequency;

instruction means for capturing a second control signal value output from said AGC and input to said VGA to control a gain of said VGA; and instruction means for characterizing said VGA by determining a difference between said first amplitude and said second amplitude with respect to a difference between said first control signal value and said second control signal value.

36. The product according to claim 27, further comprising:

instruction means for applying a test input signal to said circuit, said test input signal having said first amplitude and said particular frequency;

instruction means for capturing a third control signal value output from said AGC and input to said VGA to control a gain of said VGA; and instruction means for characterizing said device by determining a result of a value times said VGA characterization, said value being a difference of said first control signal value and said third value.

37. The product according to claim 36, further comprising:

instruction means for determining whether said device passed said test by comparing said characterization of said device to a expected gain response versus frequency.

38. The product according to claim 27, wherein said device under test is a continuous-time device.

39. The product according to claim 27, wherein said device under test is a discrete-time device.

* * * * *